(12) United States Patent
Kimura

(10) Patent No.: US 10,197,911 B2
(45) Date of Patent: Feb. 5, 2019

(54) IMPRINT APPARATUS AND METHOD OF MANUFACTURING ARTICLE

(71) Applicant: CANON KABUSHIKI KAISHA, Tokyo (JP)

(72) Inventor: Masahiro Kimura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 15/110,129

(22) PCT Filed: Jan. 8, 2015

(86) PCT No.: PCT/JP2015/050994
§ 371 (c)(1),
(2) Date: Jul. 7, 2016

(87) PCT Pub. No.: WO2015/111504
PCT Pub. Date: Jul. 30, 2015

(65) Prior Publication Data
US 2016/0327857 A1    Nov. 10, 2016

(30) Foreign Application Priority Data

Jan. 21, 2014    (JP) .................................. 2014-008857

(51) Int. Cl.
*G03F 7/20*    (2006.01)
*G03F 7/00*    (2006.01)

(52) U.S. Cl.
CPC .................. *G03F 7/0002* (2013.01)

(58) Field of Classification Search
CPC ... G03F 7/0002; G03F 7/7035; G03F 7/70858
See application file for complete search history.

(56) References Cited

U.S. PATENT DOCUMENTS 7,090,716 B2    8/2006    McMackin et al.
7,462,028 B2    12/2008    Cherala et al.
(Continued)

FOREIGN PATENT DOCUMENTS

JP    2007509769 A    4/2007
JP    2009532245 A    9/2009
(Continued)

OTHER PUBLICATIONS

International Search Report issued in Intl. Appln. No. PCT/JP2015/050994 dated Mar. 10, 2015.
Written Opinion issued in Intl. Appln. No. PCT/JP2015/050994 dated Mar. 10, 2015.
(Continued)

*Primary Examiner* — Steven Whitesell Gordon
(74) *Attorney, Agent, or Firm* — Rossi, Kimms & McDowell LLP

(57) ABSTRACT

An imprint apparatus which transfers a pattern of a mold onto a substrate is provided. The imprint apparatus includes a plurality of gas supply units each supplying a gas for substituting for air in the space between an original and the substrate. A control unit of the imprint apparatus controls the gas flow rate from each gas supply unit in accordance with the area of a portion where the original and the substrate overlap in a plan view after relatively moving the original and the substrate such that a target shot region on the substrate is positioned immediately under the pattern surface of the original.

16 Claims, 9 Drawing Sheets

(56) References Cited

U.S. PATENT DOCUMENTS

| | | | |
|---|---|---|---|
| 2006/0215137 A1* | 9/2006 | Hasegawa | G03F 7/70916 355/53 |
| 2007/0063384 A1* | 3/2007 | Choi | B29C 43/003 264/319 |
| 2009/0057267 A1* | 3/2009 | Wuister | B82Y 10/00 216/52 |
| 2010/0237045 A1* | 9/2010 | Koshiba | B82Y 10/00 216/48 |
| 2011/0018167 A1* | 1/2011 | Koole | B82Y 10/00 264/293 |
| 2011/0273684 A1 | 11/2011 | Owa et al. | |
| 2012/0199997 A1* | 8/2012 | Tanabe | B82Y 10/00 264/82 |
| 2013/0241096 A1* | 9/2013 | Shudo | B29C 59/022 264/40.5 |
| 2015/0042012 A1 | 2/2015 | Nakagawa et al. | |

FOREIGN PATENT DOCUMENTS

| | | | | |
|---|---|---|---|---|
| JP | 2010225693 A | 10/2010 | | |
| JP | 2013026603 A | 2/2013 | | |
| JP | 2013038191 A | 2/2013 | | |
| JP | WO 2013042350 A1 * | 3/2013 | | B29C 59/002 |
| JP | 2013062287 A | 4/2013 | | |
| JP | 2013175631 A | 9/2013 | | |
| WO | 2005033797 A2 | 4/2005 | | |
| WO | 2007123805 A2 | 11/2007 | | |
| WO | 2009153925 A1 | 12/2009 | | |
| WO | 2013128888 A1 | 9/2013 | | |

OTHER PUBLICATIONS

Office Action issued in Japanese Application No. 2014-008857 dated Sep. 19, 2017.

* cited by examiner

F I G. 5A 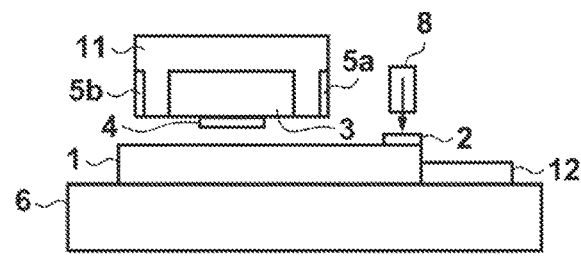
F I G. 5B 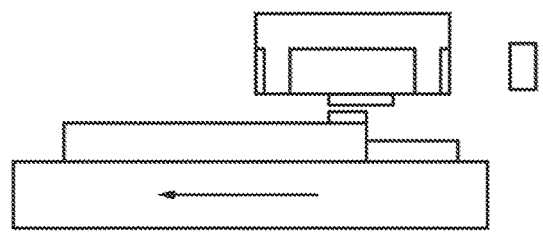
F I G. 5C 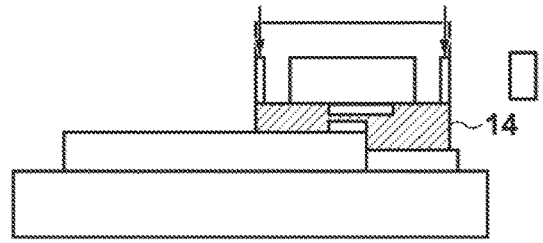
F I G. 5D 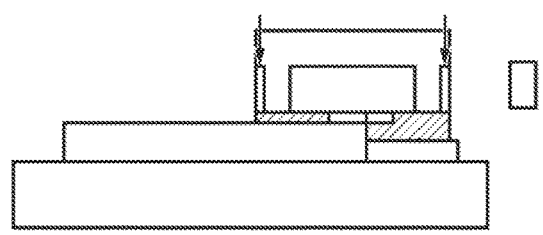
F I G. 5E 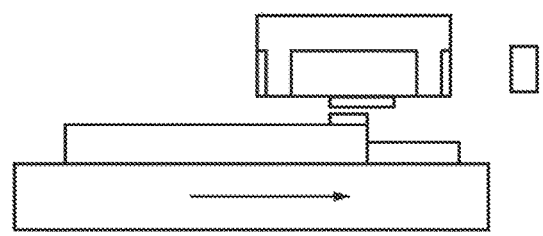

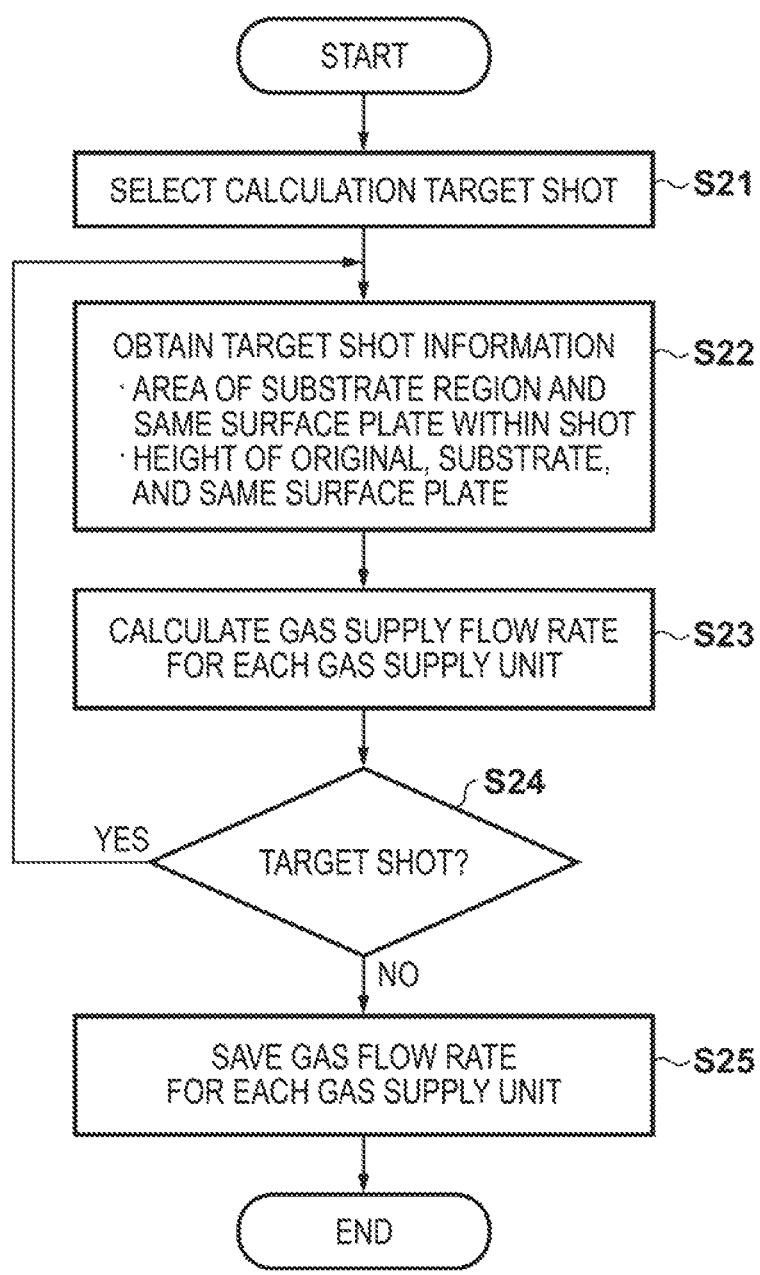

IMPRINT APPARATUS AND METHOD OF MANUFACTURING ARTICLE

TECHNICAL FIELD

The present invention relates to an imprint apparatus and a method of manufacturing an article.

BACKGROUND ART

Recently, an imprint technique is coming into practical use as a technique for manufacturing a semiconductor device. In the imprint technique, a resin supplied (coated) onto a substrate is cured in a state in which a mold (original) on which a micropattern has been formed and the resin are brought into contact with each other.

A photo-curing method is known as one of resin curing methods in the imprint technique. In the photo-curing method, a resin pattern is formed on the substrate by performing ultraviolet-light irradiation in a state in which a transparent mold is in contact with an ultraviolet-curing resin to cure and expose the resin to light, and then separating (releasing) the mold.

It is known that if a bubble remains between a mold and a resin on the surface of a substrate with which the resin has been coated when imprinting the mold onto the substrate, a pattern to be formed is distorted. As a measure for this, Japanese Patent Laid-Open No. 2007-509769 discloses a technique of supplying a gas such as helium or carbon dioxide having high diffusibility or high solubility to the resin such that the bubble is less likely to remain between the mold and the substrate, and substituting the gas for air in a gap between the substrate and the mold. Moreover, Japanese Patent Laid-Open No. 2007-509769 discloses a technique of generating a negative pressure in the space between a mold and a substrate and removing a gas serving as the generation source of a bubble. Furthermore, Japanese Patent Laid-Open No. 2009-532245 discloses a technique of sealing the periphery of a mold by providing a gas supply port (air bearing) and a gas recovery port provided on the upper surface of a stage to increase a gas concentration in a gap between a substrate and the mold easily.

However, when imprinting the peripheral portion of a substrate, in particular, the step between the substrate and a portion outside the substrate causes a volume difference in the space between the substrate and a mold, resulting in making difference in a necessary gas amount even within the same shot. Therefore, unevenness occurs in a gas concentration even if a plurality of gas supply units supply the gas equally. This may make it impossible to suppress a transfer failure caused by a bubble. The time for imprint increases and productivity decreases, however, if waiting until the gas concentration becomes uniform.

SUMMARY OF INVENTION

The present invention rapidly fills a gap between an original and a substrate with a gas at the time of an imprint process.

According to one aspect of the present invention, there is provided an imprint apparatus which transfers a pattern of an original onto a substrate, the apparatus comprising: a plurality of gas supply units each configured to supply a gas for substituting for air in a space between the original and the substrate; and a control unit configured to control a gas flow rate from each of the gas supply units in accordance with an area of a portion where the original and the substrate overlap in a plan view after relatively moving the original and the substrate such that a target shot region on the substrate is positioned immediately under a pattern surface of the original.

Further features of the present invention will become apparent from the following description of exemplary embodiments (with reference to the attached drawings).

BRIEF DESCRIPTION OF DRAWINGS

FIGS. 5A to 5F are views showing an example of a gas supply process according to the embodiment;

FIG. 6 is a flowchart showing a gas flow rate determination process according to the embodiment;

DESCRIPTION OF EMBODIMENTS

Figure 1:
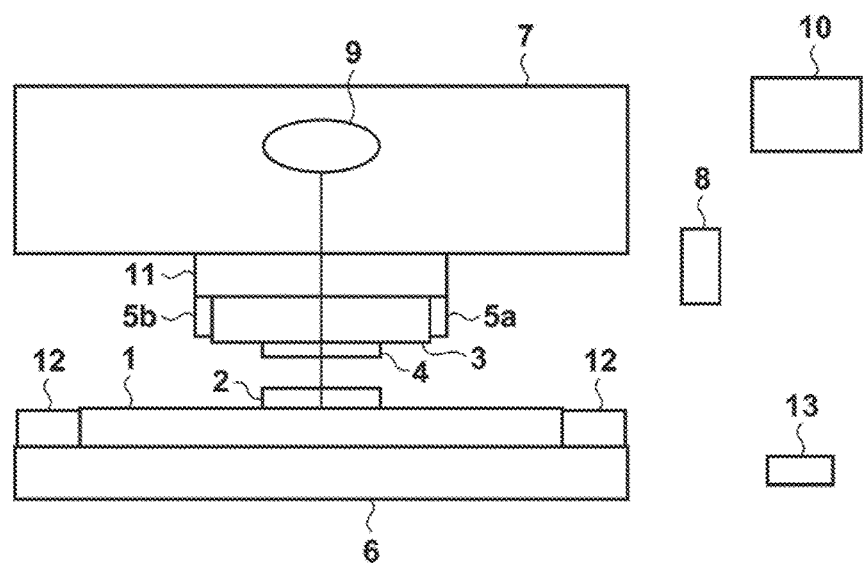
FIG. 1 is a schematic view showing an imprint apparatus according to an embodiment.

Various exemplary embodiments, features, and aspects of the invention will be described in detail below with reference to the drawings.

Preferred embodiments of the present invention will be described in detail below with reference to the accompanying drawings. Note that the following embodiments are not intended to limit the present invention and are merely concrete examples advantageous in practicing the invention. Also, not all combinations of features to be described below in the embodiments are indispensable for the means to solve the problems according to the present invention. The same components are given the same reference numerals and the repetitive description will be omitted.

<First Embodiment>

FIG. 1 is a schematic view showing an imprint apparatus according to this embodiment. The imprint apparatus performs, for each shot region on a substrate 1, an imprint process of curing a resin 2 serving as an imprint material coating the substrate 1 by irradiating the resin 2 with light in a state in which the resin 2 and a pattern surface 4 of an original 3 formed by a mold are in contact with each other. An illumination system 9 irradiates the resin 2 with ultraviolet light to cure the resin 2 which is in contact with the original 3. The original 3 includes the pattern surface 4 arranged near its center, and is made of a member which transmits ultraviolet light for curing the resin 2. An imprint structure 7 which holds the original 3 and an imprint mechanism unit 11 serving as a driving unit which presses the original 3 downward form an original mechanism unit. The imprint mechanism unit 11 has not only a function of vertical operation but also functions of orientation control and alignment in a rotation direction to bring the transfer surface of the original 3 and the substrate 1 into tight contact with each other.

The substrate 1 is an object onto which a transfer pattern has been formed on the pattern surface 4 is transferred and a semiconductor integrated circuit is formed after going through a later process, and the same as that used in a conventional semiconductor process. The substrate 1 is mounted on a stage 6 and held by a substrate holder (not shown). In this embodiment, a same surface plate 12 serving as an auxiliary plate for minimizing the step between the substrate 1 and the stage 6 is also provided along the outer peripheral portion of the substrate 1.

The original 3 and the substrate 1 are formed to be able to move relatively along a substrate surface. In this embodiment, the stage 6 can move in an x-y plane direction, an interferometer 13 measures the position of the stage 6, and positioning can be performed based on that measurement result. This makes it possible to transfer a pattern on the entire surface of the substrate 1. The stage 6 can also perform accurate positioning and achieves the overlay of micropatterns. Furthermore, the stage 6 has roles of not only positioning but also adjusting the orientation of the surface of the substrate 1. A resin coating unit 8 supplies the resin 2 before ultraviolet-light irradiation, that is, before curing to coat the substrate 1.

A controller 10 is electrically connected to the respective units described above and controls them to perform an imprint process to be described later. The controller 10 can be formed by a computer including a memory such as a CPU, a RAM, or a ROM.

First, the controller 10 controls the stage 6 to position the substrate 1 such that a shot region (to be referred to as a "target shot region" hereinafter) of an imprint process target on the substrate 1 is positioned under the resin coating unit 8. Next, the controller 10 controls the resin coating unit 8 to coat the target shot region with an appropriate amount of resin 2. Then, the controller 10 controls the stage 6 to move such that the target shot region is positioned immediately under the pattern surface 4. After the completion of the positioning, the controller 10 controls the imprint mechanism unit 11 to descend the original 3 and brings the pattern surface 4 into contact with the resin 2 which is coated on the target shot region to imprint. After the imprint, the controller 10 controls the illumination system 9 to irradiate the resin 2 with ultraviolet light to cure. After the completion of curing the resin 2, the controller 10 controls the imprint mechanism unit 11 to raise the original 3. Then, the controller 10 controls the stage 6 to move a next target shot region to be under the resin coating unit 8. The controller 10 can store a series of these operations as a recipe. Not only the series of operations described above but also, for example, a shot layout, imprint order, and the imprint conditions (such as the exposure amount and the coating amount) of each shot can be set as the recipe. Information on imprint to be set as the recipe will be referred to as imprint information hereinafter. An imprint process having the same condition can perform the same process repeatedly using the same recipe.

If a bubble remains between the pattern surface 4 and the resin 2 on the surface of the shot region with which the resin 2 has been coated when imprinting the pattern surface 4 of the original 3 into the shot region, a pattern to be formed is distorted and a transfer failure occurs depending on the degree of the distortion. To prevent this, air in the space between the original 3 and the substrate 1 is substituted by a gas such as helium or carbon dioxide having high solubility to the resin 2, thereby suppressing the generation of the bubble. Therefore, the imprint apparatus according to this embodiment includes a plurality of gas supply units (for example, four gas supply units) each supplying the gas for substituting for the air between the original and the substrate 1.

As a gas filling method, a method is known which supplies, at least immediately before imprint, the gas such as helium from a first gas supply unit 5a or a second gas supply unit 5b arranged in the vicinity of the original 3, thereby increasing the gas concentration in the periphery of the original 3 as much as possible. This makes it possible, by the diffusion effect of the gas itself, to sufficiently increase (for example, the gas concentration of 70% or more) the gas concentration in the vicinity of the pattern surface 4 arranged near the center of the original 3 as well after a set period of time, and to reduce the transfer failure by later imprint.

However, this gas filling method has a problem to be described below.

Figure 2A:
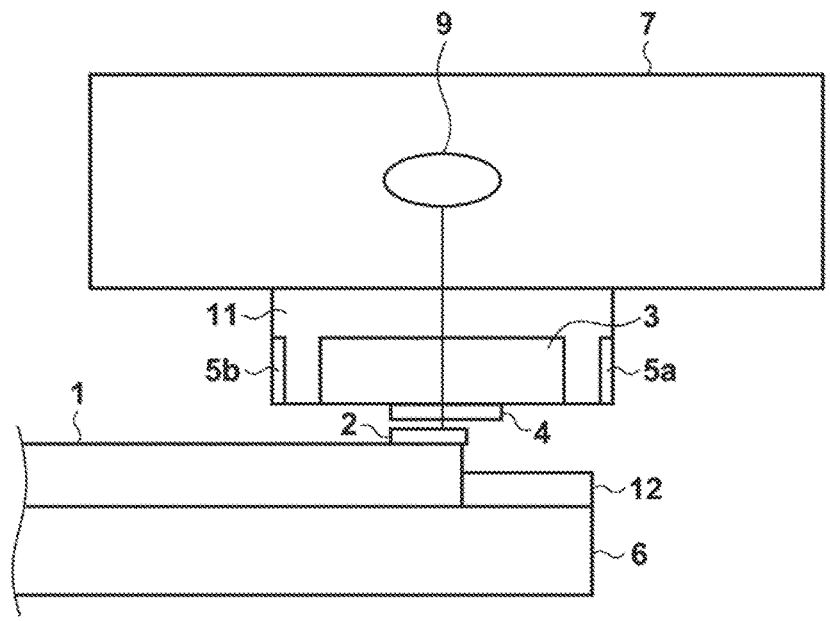
FIGS. 2A and 2B are views for explaining a problem created when the imprint apparatus imprints a substrate peripheral portion.

FIG. 2A is a view showing the imprint apparatus when the target shot region is in the peripheral portion of the substrate 1. The target shot region is smaller than the pattern surface 4 of the original 3 in the peripheral portion of the substrate 1. This shot will be referred to as an "edge shot". While the same surface plate 12 is provided to have an equal height to the substrate 1, the substrate has, for example, a variation in thickness. As a result, the distance (for example, 30 µm) between the original 3 and the substrate 1 held by the stage 6 differs from the distance (for example, 300 µm) between the original 3 and the same surface plate 12. In the edge shot, therefore, the volume of the space between the original 3 and the substrate 1 becomes different from that between the original 3 and the same surface plate 12.

Figure 2B:
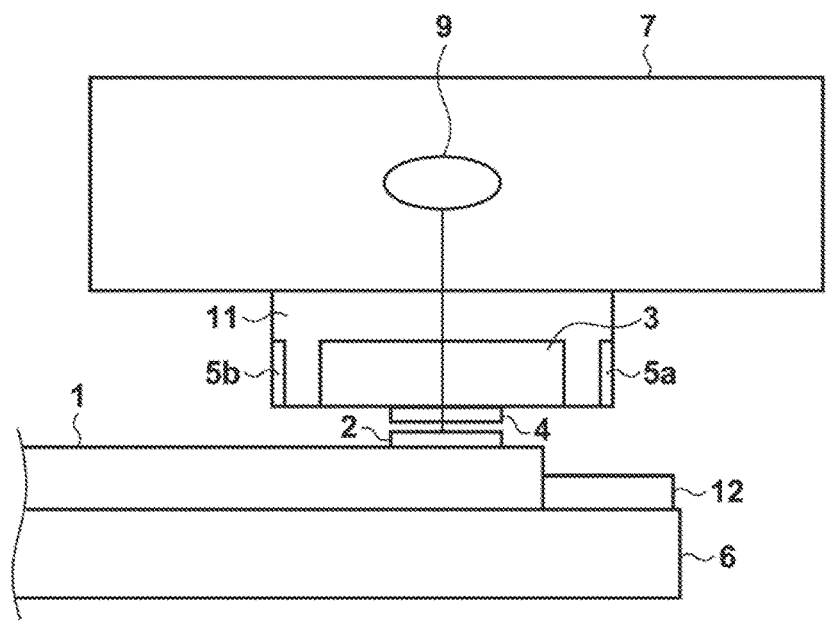

FIG. 2B shows not the edge shot but the imprint apparatus when the peripheral portion of the substrate 1 is closer to the center of the original 3 than the first gas supply unit 5a. As in the edge shot, the volume of the space between the original 3 and the substrate 1 also becomes different from that between the original 3 and the same surface plate 12.

Therefore, when each of the first gas supply unit 5a and the second gas supply unit 5b supplies the same amount of gas, a set wait time is required until the gas concentrations become equal. This is because the volume of the space between the original 3 and the substrate 1 differs from that between the original 3 and the same surface plate 12, and thus the gas amounts to become equal gas concentrations are different. The wait time varies depending on the arrangement around the original 3 and the necessary concentration. Assuming that a general imprint apparatus is used, an expected wait time is 1 sec to several ten sec. This wait time is required to be short as much as possible because of its influence on productivity.

The gas supplied by the second gas supply unit 5b fills the volume of the space between the original 3 and the substrate 1, and then the remainder of the gas leaks outside the space until the gas supplied from the first gas supply unit 5a fills the space between the original 3 and the same surface plate 12. When this leaking gas reaches the vicinity of the optical path of the interferometer 13, an error may occur in the position measurement of the stage 6 by the interferometer 13. Furthermore, the leaking gas becomes useless, and it may also have an influence on the running cost of the apparatus. Therefore, the supply amount of gas is required to be small as much as possible.

To achieve this, in this embodiment, a gas filling method to be described below is used to rapidly increase the gas concentration in the space between the original 3 and the substrate 1.

Figure 3A:
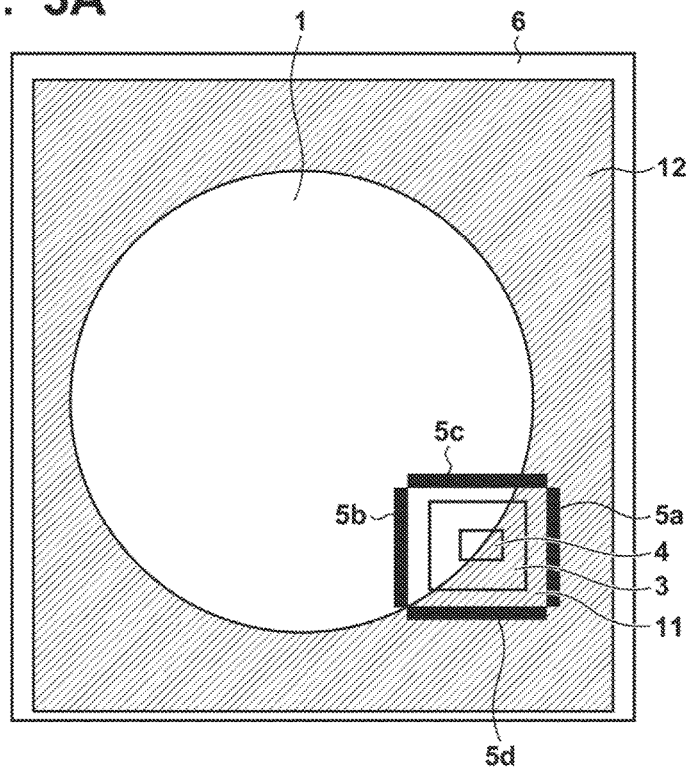
FIGS. 3A and 3B are schematic plan views showing the imprint apparatus in an edge shot.
Figure 4:
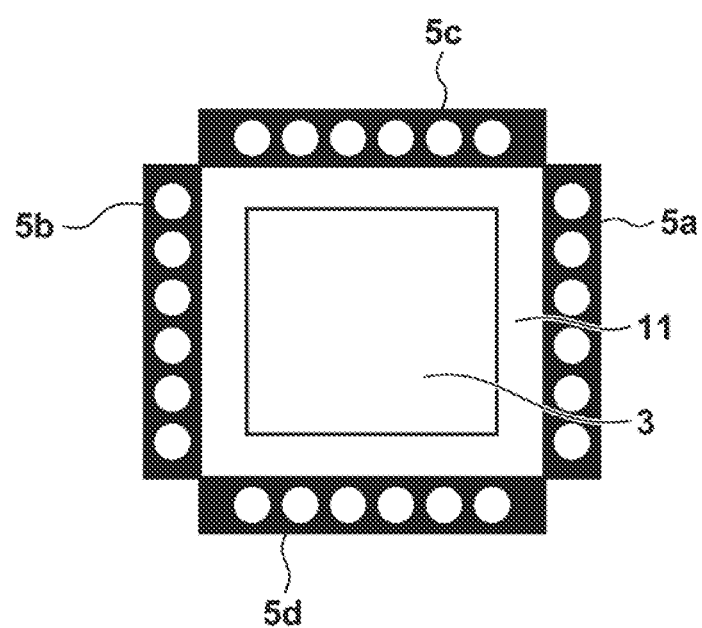
FIG. 4 is a view showing an example of the arrangement of gas supply units according to the embodiment.

FIG. 3A is a schematic plan view showing the imprint apparatus in the edge shot. The first gas supply unit 5a, the second gas supply unit 5b, a third gas supply unit 5c, and a fourth gas supply unit 5d are arranged to surround the original 3. Each gas supply unit may be formed to arrange a plurality of supply ports, as shown in FIG. 4. The controller 10 independently controls the gas flow rate from each gas supply unit. For example, the controller 10 controls, in each of a plurality of shots, the gas flow rate from each gas supply unit in accordance with the volume of the space between the original and the substrate.

Figure 5F:
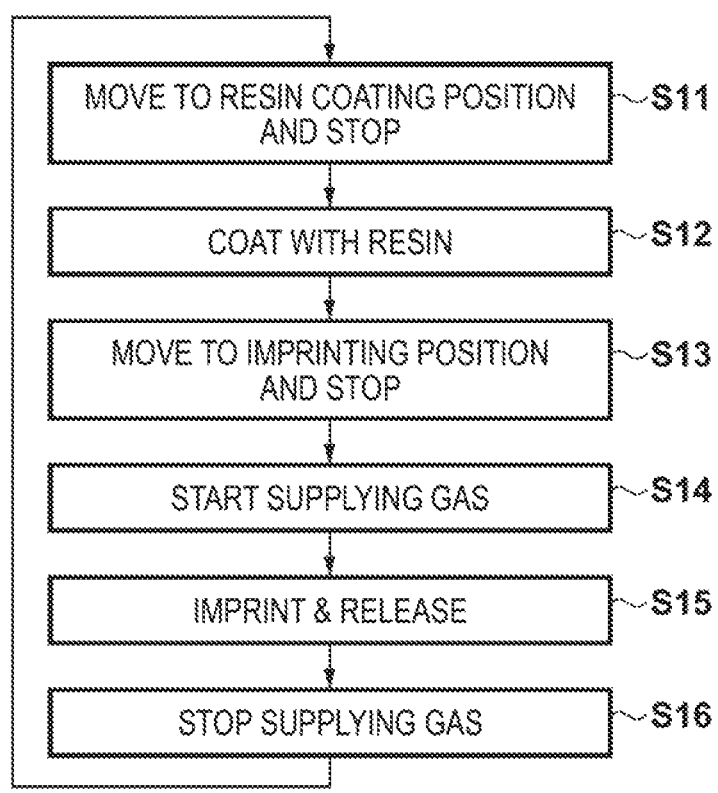

An example of a concrete gas supply method in the edge shot will be described below with reference to FIGS. 5A to 5F. FIG. 5A shows a state in which the resin coating unit 8 coats the target shot region on the substrate 1 with the resin 2, and this corresponds to step S12 in FIG. 5F. At this point, each gas supply unit has not supplied a gas yet.

FIG. 5B shows a state in which after the coating with the resin 2, the controller 10 controls the stage 6 to move in a left direction in FIG. 5B such that the target shot region is positioned immediately under the pattern surface 4, and this corresponds to step S13. Also at this point, each gas supply unit has not supplied the gas yet.

FIG. 5C shows a state in which the movement of the stage 6 has been completed, the target shot region is positioned right under the pattern surface 4, and each of the first gas supply unit 5a and the second gas supply unit 5b starts supplying the gas, and this corresponds to step S14. The hatched region between the original 3 and the substrate 1, and the original 3 and the same surface plate 12 in FIG. 5C will be referred to as an "imprint region". FIG. 5C shows a state in which a gas 14 fills the imprint region. The space (the left half of the gas 14 in FIG. 5C) between the original 3 and the substrate 1 and the space (the right half of the gas 14 in FIG. 5C) between the original 3 and the same surface plate 12 differ in volume. Therefore, when each of the first gas supply unit 5a and the second gas supply unit 5b supplies the gas 14 in the same amount, a time difference occurs by the time the gas concentrations in two spaces become uniform. In this embodiment, therefore, the controller 10 controls the gas supply amount (that is, the gas flow rate) per unit time from each gas supply unit in accordance with, in the plan view, the volume of the space between the original and the substrate where they overlap each other, and the volume of the space between the original and the same surface plate where they overlap each other. More specifically, the controller 10 controls each gas supply unit to supply the gas at the flow rate in accordance with the volume of the space in the imprint region. This makes it possible to increase the gas concentration uniformly.

FIG. 5D shows a state in which the imprint mechanism unit 11 makes the original 3 descend and imprints the pattern surface 4 onto the resin 2, and this corresponds to step S15. In this state, each of the first gas supply unit 5a and the second gas supply unit 5b continues supplying the gas. The controller 10 irradiates the resin 2 with illumination light while keeping an imprint state to cure, and then controls the imprint mechanism unit 11 to raise and release the original 3. In this state, each of the first gas supply unit 5a and the second gas supply unit 5b stops supplying the gas. This operation corresponds to step S16.

FIG. 5E shows a state in which the stage 6 is moved immediately under the resin coating unit 8 to coat the next target shot region with the resin 2, and this corresponds to step S11. After that, coating the target shot region with the resin 2 is started, and the process returns to the state in FIG. 5A, that is, the state in step S12 and repeats the sequence.

Note that the target shot is the edge shot in this sequence. However, the same also applies to a case in which the target shot is not the edge shot but, as shown in FIG. 2B, the peripheral portion of the substrate 1 is closer to the center of the original 3 than the first gas supply unit 5a.

A calculation method of the optimal gas flow rate supplied by each gas supply unit will now be described with reference to FIGS. 3A and 3B, and FIG. 6.

FIG. 3A is a schematic plan view showing the imprint apparatus in the edge shot. FIG. 3B is an enlarged view showing the imprint region in FIG. 3A. In FIG. 3B, the gas supply region of each gas supply unit arranged on the edge of the original 3 is divided by a region A, a region B, a region C, and a region D, and shown.

FIG. 6 is a flowchart showing a method by which the controller 10 calculates, for each shot, the gas flow rate from each gas supply unit at the time of recipe creation. In step S21 of FIG. 6, the controller 10 selects, out of all shots, one or the plurality of shots (to be referred to as a "calculation target shot" hereinafter) required to calculate the gas flow rate. More specifically, a shot where the original 3 extends across the substrate 1 and the same surface plate 12 in the plan view as shown in FIG. 3A is selected from layout information set in the recipe. The subsequent processes from steps S22 to S23 are performed on each of these calculation target shots selected in step S21. On the other hand, the gas flow rate set in advance is set in this shot unselected in step S21.

In step S22 of FIG. 6, information on the calculation target shot is obtained from the recipe. The obtained information includes the area of the portion (to be referred to as a "substrate region" hereinafter) where the original 3 and the substrate 1 overlap in the plan view, the area of the portion (to be referred to as a "same surface plate region" hereinafter) where the original 3 and the same surface plate 12 overlap in the plan view, the distance between the original 3 and the substrate 1, and the distance between the original 3 and the same surface plate 12. In step S23 of FIG. 6, the gas flow rate of each gas supply unit in the calculation target shot is calculated based on the information obtained in step S22. First, the area of the substrate region and the area of the same surface plate region in each gas supply region shown in FIG. 3B are calculated here using the area of the substrate region and the area of the same surface plate region. Then, the volume of the substrate region in the gas supply region is calculated from the area of the substrate region, and the distance between the original 3 and the substrate 1. Also, the volume of the same surface plate region in the gas supply region is calculated from the area of the same surface plate region, and the distance between the original 3 and the same surface plate 12. The sum of the calculated volumes of the substrate region and the same surface plate region is set as the volume of the gas supply region.

Figure 3B:
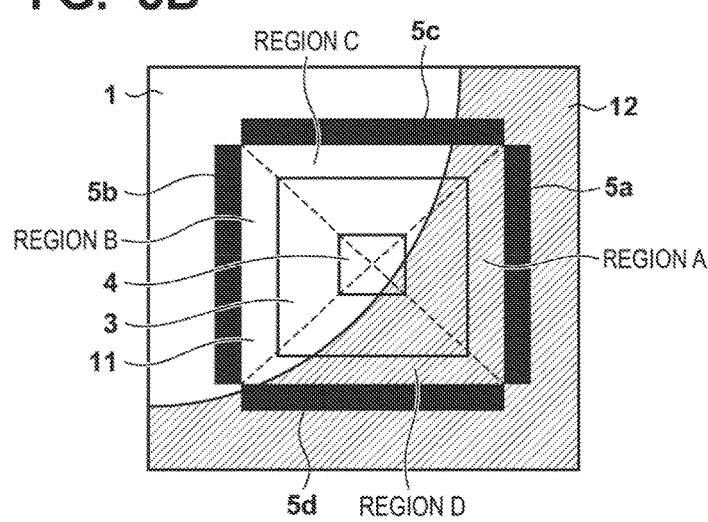

For example, the volume of the region C of the third gas supply unit 5c in FIG. 3B is calculated as follows:

the volume of the region C=(the area of the same surface plate region in the region C*the distance between the original 3 and the same surface plate 12)+(the area of the substrate region in the region C*the distance between the original 3 and the substrate 1)

The gas flow rate of each gas supply unit is calculated to, within the performance range of the gas supply unit, obtain the volume of each gas supply region earliest and fill all the gas supply regions in a uniform concentration. If the calculation target shot which has not undergone the processes in steps S22 and S23 exists in step S24, the process returns to the state in step S22; otherwise, the process advances to step S25.

In step S25, the memory of the controller 10 stores, as a recipe, data on the gas flow rate of each gas supply unit in all the calculation target shots calculated in step S23. This is for the purpose of allowing the repetitive use of recipe stored in the memory of the controller 10 when imprinting another substrate on the same condition.

As one concrete example, the value of the gas flow rate of each gas supply unit is held for each shot as a part of the recipe holding the imprint information such as a shot layout, imprint order, and the imprint conditions of each shot. This makes it possible, when the related imprint information performs the same imprint process, to perform imprint at the gas flow rate held in the recipe without performing the process of calculating the gas flow rate described with reference to FIG. 6. As described above, the controller stores, in the memory, the data on the gas flow rate from each gas supply unit determined for each predetermined shot. As for each shot of the other substrate, the gas flow rate from each gas supply unit is controlled based on the data stored in the memory.

The arrangement may also be employed in which the data on the gas flow rate calculated in the process described with reference to FIG. 6 is transmitted to an external host computer communicatively connected to the imprint apparatus. The host computer is, for example, an online host which controls a plurality of types of semiconductor manufacturing apparatus that can include a plurality of imprint apparatuses. This allows each imprint apparatus to receive, from the host computer, the related information on imprint that has been performed in the past including the operations in the other imprint apparatuses. This makes it possible, without performing the process of calculating the gas flow rate described with reference to FIG. 6, to perform imprint while controlling the gas flow rate based on the received imprint information.

Note that in this embodiment, the gas supply unit and its supply region is divided into four regions. However, the gas supply region is not limited to four regions. For example, the supply region is divided for each of the plurality of gas supply ports in each gas supply unit of FIG. 4, and based on information on the supply region, the gas flow rate from each gas supply port may be calculated.

Also, a control method of the gas flow rate in step S23 is not limited to the above-described method. For example, a result obtained by measuring the distance between the original 3 and the substrate 1, and the distance between the original 3 and the same surface plate 12 by a measurement unit (not shown) may be used. Alternatively, the gas flow rate may be controlled in accordance with the area of the portion where the original and the substrate overlap in the plan view, instead of calculating the volume of the space between the original and the substrate.

As described above, according to this embodiment, it is possible to rapidly increase the gas concentration in the space between the original and the substrate especially in the edge shot.

<Second Embodiment>

Figure 7:
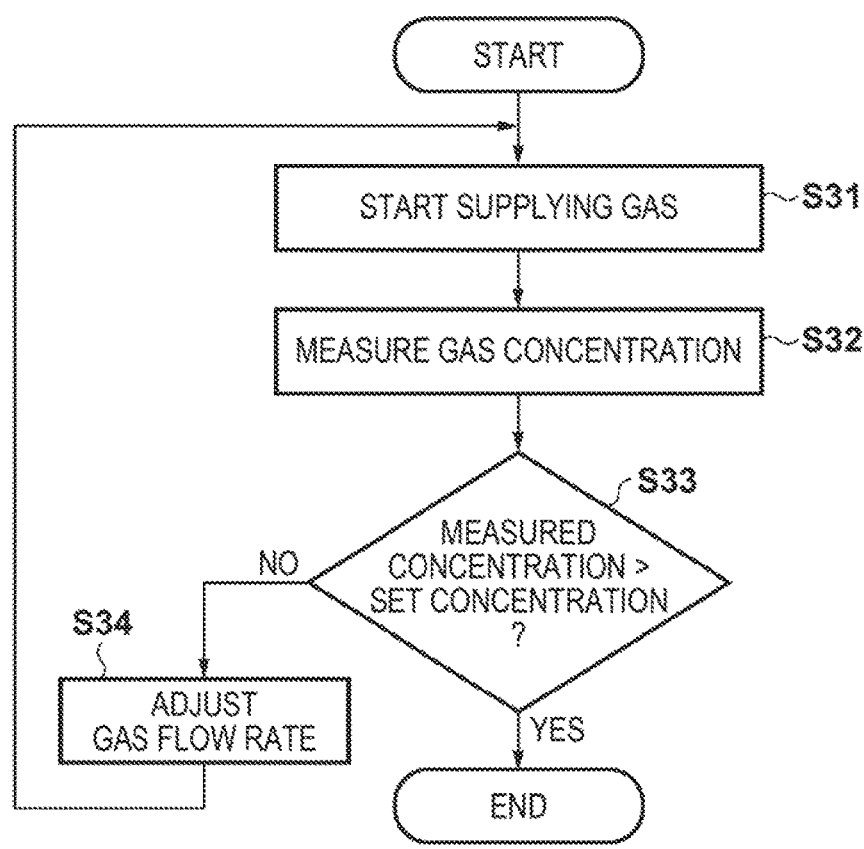
FIG. 7 is a flowchart showing a gas flow rate determination process according to an embodiment.
Figure 8A:
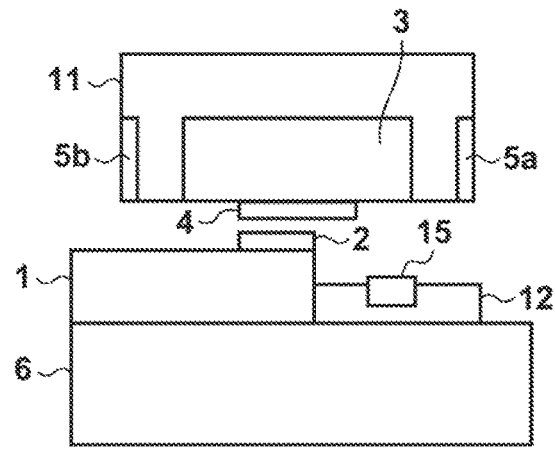
FIGS. 8A and 8B are views showing an imprint apparatus including a gas concentration measurement unit in an edge shot.
Figure 8B:
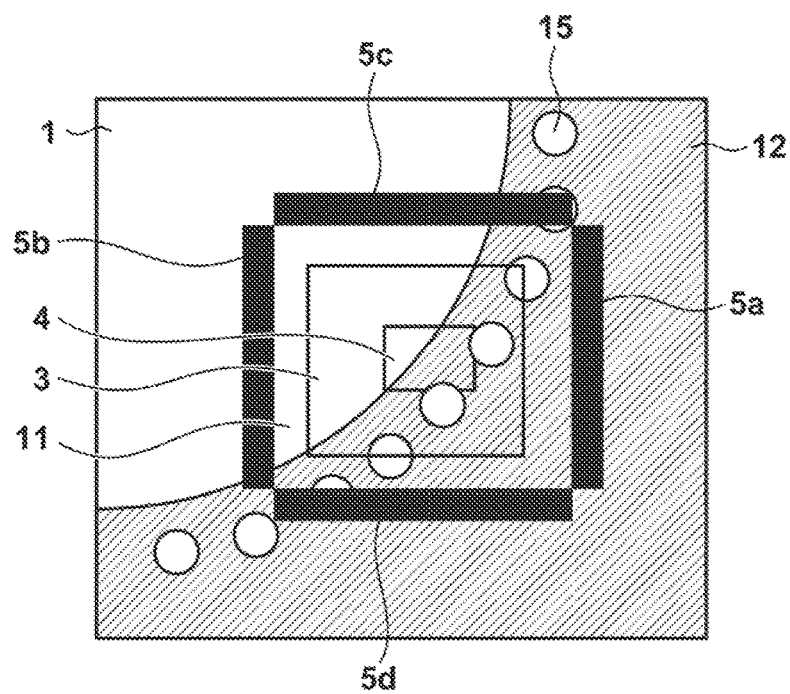

FIG. 7 is a flowchart showing a method of calculating, by a controller 10, the gas flow rate supplied by each gas supply unit at the time of gas supply for each shot. This embodiment is different from the first embodiment in that the gas flow rate for each gas supply unit is calculated while measuring a gas concentration. FIG. 8A shows an imprint apparatus including a gas concentration measurement unit 15 in an edge shot. FIG. 8B is a schematic plan view showing the above-described imprint apparatus in the edge shot. The plurality of gas concentration measurement units 15 are arranged on a same surface plate 12 at the edge of a substrate 1.

Gas supply starts in step S31. At this time, each gas supply unit has the equal gas flow rate. Next, the gas concentration is measured in step S32. In this embodiment, the gas concentration is measured using the gas concentration measurement units 15 as shown in FIG. 8B. In step S33, it is determined whether the gas concentration measured in step S32 exceeds a value set as the gas concentration suitable for imprint. If the gas concentration exceeds the set value, this sequence ends. If the gas concentration has not reached the set value yet, the process transits to step S34. The controller 10 determines how much flow rate adjustment is required for which gas supply unit based on the measurement result by each gas concentration measurement unit, the position information of a target shot, and the position information of each gas concentration measurement unit. In step S34, the gas flow rate is adjusted. The controller 10 controls, based on the determination in step S33, each gas supply unit to supply the optimal gas flow rate to the imprint region. If the measurement result does not reach a set concentration, the sequence is repeated until the result reaches the set concentration.

The controller 10 may store, as a recipe, the gas flow rate of each gas supply unit determined in step S33. This is for the purpose of allowing the repetitive use of recipe stored in the controller 10 when imprinting another substrate on the same condition.

As one concrete example, the gas flow rate of each gas supply unit is held for each shot as a part of the recipe holding the imprint information such as a shot layout, imprint order, and the imprint conditions of each shot. This makes it possible, when the related imprint information performs the same imprint process, to perform imprint at the gas flow rate held in the recipe without performing the process of calculating the gas flow rate described with reference to FIG. 6.

The arrangement may also be employed in which the gas flow rate calculated in the process described with reference to FIG. 6 is transmitted to a host computer communicatively connected to the imprint apparatus. This allows the imprint apparatus to receive, from a computer, the related information on imprint that has been performed in the past including operations in another imprint apparatus. This makes it possible, without performing the process of calculating the gas flow rate described with reference to FIG. 6, to perform imprint while controlling the gas flow rate based on the received imprint information.

Note that in this embodiment, the gas concentration measurement unit is arranged on the same surface plate. However, the gas concentration measurement unit is not necessarily arranged on the same surface plate. The gas concentration measurement unit may be arranged on, for example, the edge of the gas supply unit or the edge of an imprint mechanism unit.

Furthermore, in step S31, each gas supply unit has the equal gas flow rate. However, the gas flow rates need not necessarily equal. The gas flow rate may be changed for each gas supply unit based on, for example, a measurement result obtained in advance.

As described above, according to this embodiment, it is possible to obtain the same effect as in the first embodiment by adjusting the gas flow rate from each gas supply unit based on the measurement result of the gas concentration.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of transferring the pattern of an original onto a substrate using the above-described imprint apparatus, and a step of processing the substrate onto which the pattern has been transferred in the preceding step. This manufacturing method further includes other known steps (oxidation, deposition, vapor deposition, doping, planarization, etching, resist peeling, dicing, bonding, packaging, and the like). The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-008857, filed Jan. 21, 2014, which is hereby incorporated by reference herein in its entirety.

The invention claimed is:

1. An imprint apparatus which transfers a pattern of an original onto a substrate, the apparatus comprising:
 a plurality of gas supply units each configured to supply a gas for substituting for air in a space between the original and the substrate; and
 a control unit configured to control a gas flow rate from each of said gas supply units based on an area value of a portion where the original and the substrate overlap in a plan view after relatively moving the original and the substrate such that a target shot region on the substrate is positioned under a pattern surface of the original.

2. The apparatus according to claim 1, wherein the control unit is configured to store, in a memory, data on the gas flow rate from each of the plurality of gas supply units determined for a predetermined shot region on a substrate and, as for a shot region on another substrate, control the gas flow rate from each of the plurality of gas supply units based on the data stored in the memory.

3. The apparatus according to claim 1, wherein the control unit is configured to transmit the data on the gas flow rate from each of the gas supply units determined for a predetermined shot region on a substrate to an external host computer, and as for a shot region on another substrate, receive the data from the host computer and control the gas flow rate from each of the plurality of gas supply units based on the data.

4. An imprint apparatus which transfers a pattern of an original onto a substrate, the apparatus comprising:
 an auxiliary plate provided along an outer peripheral portion of the substrate;
 a plurality of gas supply units each configured to supply a gas for substituting for air in a space between the original and the substrate; and
 a control unit configured to control a gas flow rate from each of said gas supply units based on, in a plan view, a volume value of a space between the original and the substrate where the original and the substrate overlap, and a volume value of a space between the original and said auxiliary plate where the original and said auxiliary plate overlap after relatively moving the original and the substrate such that a target shot region on the substrate is positioned under a pattern surface of the original.

5. An imprint apparatus which transfers a pattern of an original onto a substrate, the apparatus comprising:
 a stage configured to move while holding the substrate;
 an auxiliary plate disposed on the stage along an outer peripheral portion of the substrate;
 a plurality of gas supply units configured to supply a gas for substituting for air in a space between the mold and the substrate;
 a plurality of gas concentration measurement units disposed on the auxiliary plate and configured to measure a gas concentration in the space between the mold and the substrate; and
 a control unit configured to control a gas flow rate from each of the plurality of gas supply units based on the gas concentration measured by each of the plurality of gas concentration measurement units in a state of positioning a target shot region of the substrate under a pattern portion of the original.

6. The imprint apparatus according to claim 5, wherein the control unit is configured to control the gas flow rate from each of the plurality of gas supply units based on the gas concentration measured by each of the plurality of gas concentration measurement units in a state of positioning a target shot region of the substrate under a pattern portion of the original, a position of the target shot region, and a position of each of the plurality of gas concentration measurement units.

7. The imprint apparatus according to claim 5, wherein in a state of positioning an edge shot region including an edge of the substrate under the pattern portion of the original, the plurality of gas concentration measurement units is configured to measure the gas concentration and the control unit is configured to control the gas flow rate based on the measured gas concentration.

8. The imprint apparatus according to claim 7, wherein in the state of positioning the edge shot region of the substrate under the pattern portion of the original, at least one of the plurality of gas concentration measurement units disposed inside an area surrounded by the plurality of gas supply units is configured to measure the gas concentration.

9. The imprint apparatus according to claim 5, wherein the control unit is configured to determine the gas flow rate based on the measured gas concentration and positions of the plurality of gas concentration measurement units.

10. The imprint apparatus according to claim 5, wherein the control unit is configured to determine the gas flow rate when the pattern of the original is transferred onto each of a plurality of shot regions of the substrate and store data of the determined gas flow rate about each shot region, and
 wherein the control unit is configured to control the gas flow rate using the stored data of the gas flow rate when the pattern of the original is transferred onto another substrate.

11. A method of manufacturing an article, the method comprising:
 forming a pattern on a substrate using an imprint apparatus which transfers a pattern of an original onto a substrate; and
 processing the substrate, on which the pattern has been formed, to manufacture the article,
 wherein the imprint apparatus includes:
  a stage configured to move while holding the substrate;
  an auxiliary plate disposed on the stage along an outer peripheral portion of the substrate;
  a plurality of gas supply units configured to supply a gas for substituting for air in a space between the mold and the substrate;
  a plurality of gas concentration measurement units disposed on the auxiliary plate and configured to measure a gas concentration in the space between the mold and the substrate; and a control unit configured to control a gas flow rate from each of the plurality of gas supply units based on the gas concentration measured by each of the plurality of gas concentration measurement units in a state of positioning a target shot region of the substrate under a pattern portion of the original.

12. An imprint apparatus which transfers a pattern of an original onto a substrate, the apparatus comprising:

a stage configured to move while holding the substrate;

an auxiliary plate disposed on the stage along an outer peripheral portion of the substrate;

a plurality of gas supply units configured to supply a gas for substituting for air in a space between the mold and the substrate;

a plurality of gas concentration measurement units disposed on the auxiliary plate and configured to measure a gas concentration in the space between the mold and the substrate; and a control unit configured to determine a gas supply unit to be controlled of the plurality of gas supply units based on the gas concentration measured by each of the plurality of gas concentration measurement units in a state of positioning a target shot region of the substrate under a pattern portion of the original, and control the gas flow rate from the determined gas supply unit of the plurality of gas supply units.

13. The imprint apparatus according to claim 12, wherein in a state of positioning an edge shot region including an edge of the substrate under the pattern portion of the original, the plurality of gas concentration measurement units is configured to measure the gas concentration and the control unit is configured to control the gas flow rate based on the measured gas concentration.

14. The imprint apparatus according to claim 13, wherein in the state of positioning the edge shot region of the substrate under the pattern portion of the original, at least one of the plurality of gas concentration measurement units disposed inside an area surrounded by the plurality of gas supply units is configured to measure the gas concentration.

15. The imprint apparatus according to claim 12, wherein the control unit is configured to determine the gas flow rate based on the measured gas concentration and positions of the plurality of gas concentration measurement units.

16. The imprint apparatus according to claim 12, wherein the control unit is configured to determine the gas flow rate when the pattern of the original is transferred onto each of a plurality of shot regions of the substrate and store data of the determined gas flow rate about each shot region, and wherein the control unit is configured to control the gas flow rate using the stored data of the gas flow rate when the pattern of the original is transferred onto another substrate.

* * * * *